(12) United States Patent
Hori

(10) Patent No.: US 9,954,499 B2
(45) Date of Patent: Apr. 24, 2018

(54) SWITCHING AMPLIFIER AND RADIO TRANSMITTER

(71) Applicant: NEC Corporation, Tokyo (JP)

(72) Inventor: Shinichi Hori, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/501,257

(22) PCT Filed: Apr. 24, 2015

(86) PCT No.: PCT/JP2015/002243
§ 371 (c)(1),
(2) Date: Feb. 2, 2017

(87) PCT Pub. No.: WO2016/021092
PCT Pub. Date: Feb. 11, 2016

(65) Prior Publication Data
US 2017/0230017 A1    Aug. 10, 2017

(30) Foreign Application Priority Data

Aug. 4, 2014  (JP) ................................ 2014-158527

(51) Int. Cl.
*H03F 3/217*  (2006.01)
*H03F 1/22*  (2006.01)
(Continued)

(52) U.S. Cl.
CPC .......... *H03F 3/2171* (2013.01); *H03F 1/223* (2013.01); *H03F 3/193* (2013.01); *H04B 1/04* (2013.01);
(Continued)

(58) Field of Classification Search
CPC ........ H03F 3/2171; H03F 1/223; H03F 3/193; H03F 3/217; H03F 3/2173;
(Continued)

(56) References Cited

U.S. PATENT DOCUMENTS 7,126,428 B2 * 10/2006 Lin ......................... H03F 1/223
                                                                    330/261
8,237,422 B2 *  8/2012 Singh ................... H03K 17/102
                                                                    323/282
(Continued)

FOREIGN PATENT DOCUMENTS

WO     2012/017579 A1    2/2012

OTHER PUBLICATIONS

Hongtao Xu et al.; "A Flip-Chip-Packaged 25.3 dBm Class-D Outphasing Power Amplifier in 32 nm CMOS for WLAN Application"; IEEE Journal of Solid-State Circuits; Jul. 2011; pp. 1596-1605, vol. 46; No. 7.

(Continued)

*Primary Examiner* — Khanh V Nguyen
(74) *Attorney, Agent, or Firm* — Sughrue Mion, PLLC

(57) ABSTRACT

A switching amplifier provided, at a minimum, with: a first input transistor into which one of two input signals that operate in a complementary manner is input; a first cascode transistor cascade-connected between the first input transistor and a power supply; a second input transistor into which the other of the two input signals is input; and a second cascode transistor cascade-connected between the second input transistor and the first input transistor; the switching amplifier extracting an output signal, a connection point between the first input transistor and the second cascode transistor being used as an output terminal; wherein a first potential limiting circuit and a second potential limiting circuit for limiting the potential fluctuation range are respectively connected to the input terminal of the first cascode transistor and the input terminal of the second cascode transistor.

8 Claims, 13 Drawing Sheets

(51) Int. Cl.
*H03F 3/193* (2006.01)
*H04B 1/04* (2006.01)

(52) U.S. Cl.
CPC ............ *H03F 3/217* (2013.01); *H03F 3/2173* (2013.01); *H03F 2200/258* (2013.01); *H03F 2200/432* (2013.01); *H03F 2200/451* (2013.01)

(58) Field of Classification Search
CPC ........ H03F 2200/432; H03F 1/04; H03F 1/34; H03F 2200/351; H03F 2200/78; H04B 1/04
USPC .............................................. 330/207 A, 251
See application file for complete search history.

(56) References Cited

U.S. PATENT DOCUMENTS

| | | | |
|---|---|---|---|
| 8,847,636 B2* | 9/2014 | Kerr | ................. H03K 19/00315 327/108 |
| 9,548,739 B2* | 1/2017 | Gupta | .............. H03K 19/01850 |
| 2004/0027755 A1 | 2/2004 | Hajimiri et al. | |
| 2012/0092071 A1 | 4/2012 | Mazet et al. | |
| 2013/0127556 A1 | 5/2013 | Hori | |

OTHER PUBLICATIONS

Antoine Frappé et al.; "A digital ΔΣ RF signal generator for mobile communication transmitters in 90nm CMOS"; IEEE Radio Frequency Integrated Circuits Symposium; Jun. 2008; pp. 13-16.
International Search Report for application No. PCT/JP2015/002243 dated Jul. 7, 2015.
Written Opinion for application No. PCT/JP2015/002243 dated Jul. 7, 2015.

* cited by examiner

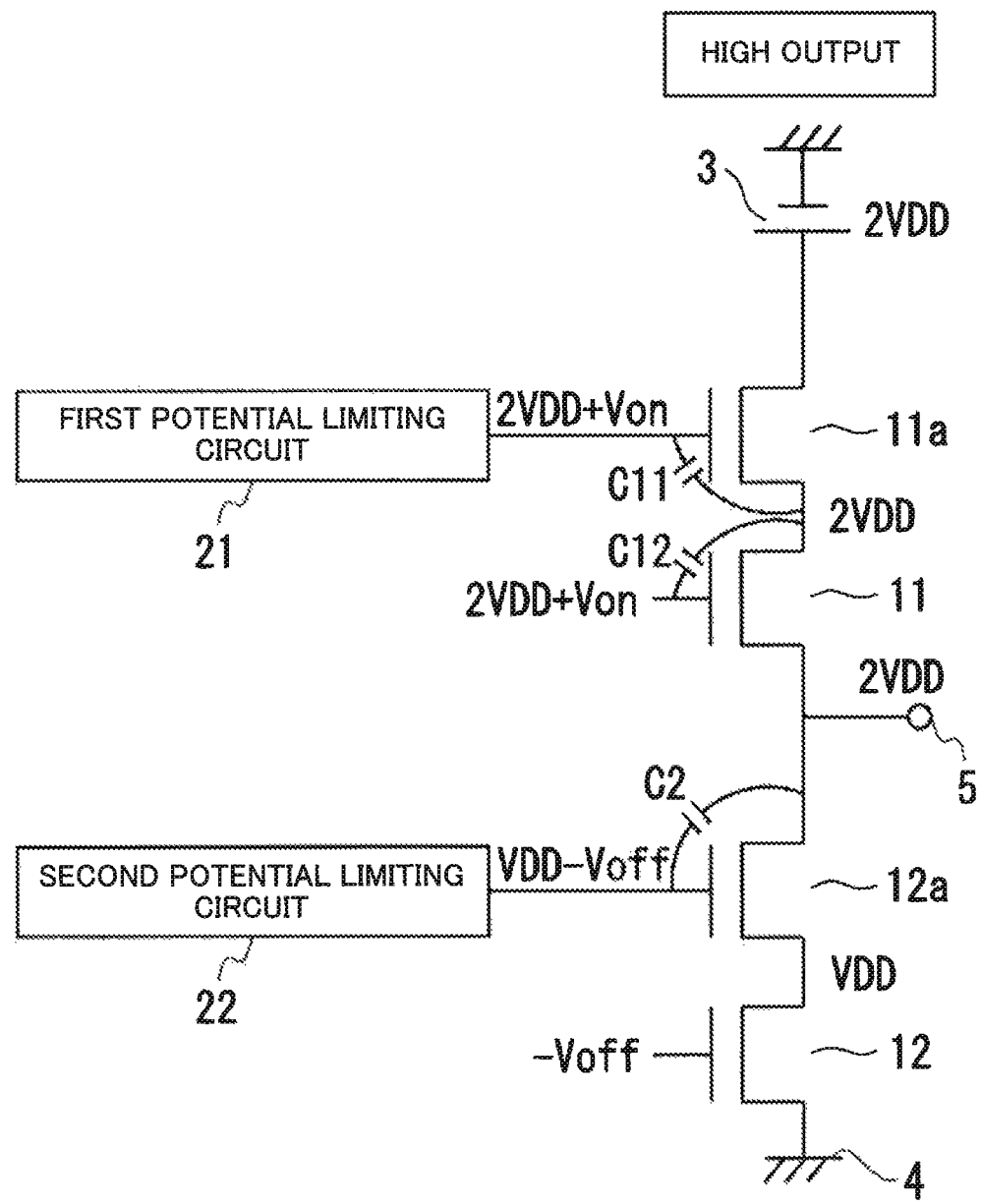

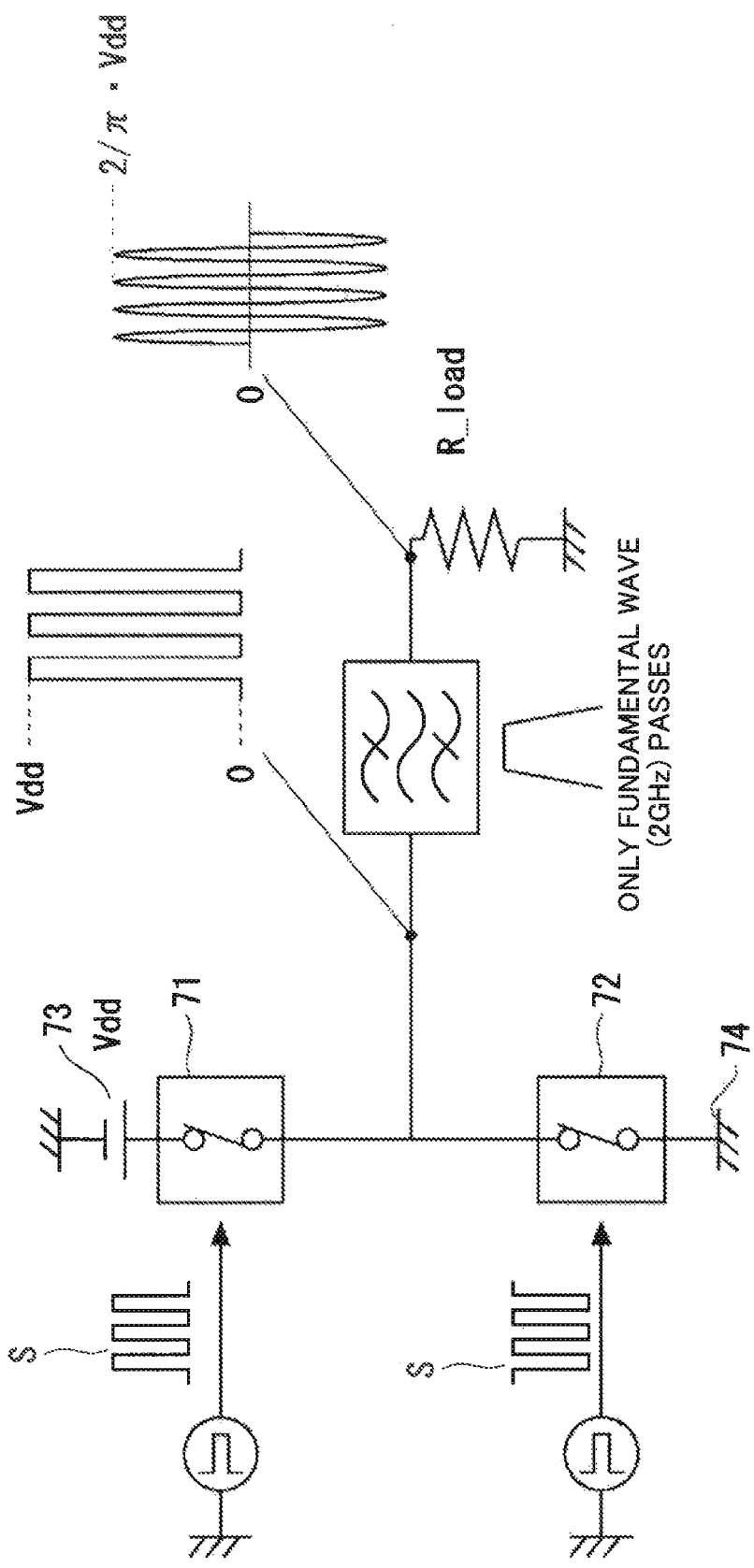

SWITCHING AMPLIFIER AND RADIO TRANSMITTER

CROSS REFERENCE TO RELATED APPLICATIONS

This is a National Stage of International Application No. PCT/JP2015/002243 filed Apr. 24, 2015, claiming priority based on Japanese Patent Application No. 2014-158527 filed Aug. 4, 2014, the contents of all of which are incorporated herein by reference in their entirety.

TECHNICAL FIELD

The present invention relates to a switching amplifier and a radio transmitter, and more particularly, to a switching amplifier and a radio transmitter for wirelessly transmitting a digital signal used in radio communication equipment such as a mobile phone and a wireless LAN.

BACKGROUND ART

A transmission part of radio communication equipment such as a mobile phone and a wireless LAN needs to operate with low power consumption while ensuring the accuracy of a transmission signal regardless of the amount of output power. Particularly, since a power amplifier at a last stage of the transmission part of the radio communication equipment occupies 50% or more of entire power consumption of the radio communication equipment, high power efficiency is required.

In recent years, as a power amplifier expected to have high power efficiency, a switching amplifier has been spotlighted. The switching amplifier assumes a pulse shape signal as an input signal and can amplify power while keeping a waveform of the input signal. The pulse shape signal amplified by the switching amplifier is radiated to the air by an antenna after a frequency component, other than a desired frequency component, is sufficiently suppressed by a filter element.

FIG. 7 is a circuit diagram illustrating a class D amplifier which is a representative example of a conventional switching amplifier. The class D amplifier illustrated in FIG. 7 has a configuration in which two switch elements 71 and 72 have been inserted in series between a power supply 73 and a ground (GND) 74. Complementary pulse signals S1 and S2 are respectively input to the two switch elements 71 and 72 as an open/close control signal S so that only one of the two switch elements 71 and 72 is controlled to be in an ON state. For the output of the class D amplifier, when the switch element 71 of the power supply 73 side is ON and the switch element 72 of the ground 74 side is OFF, a voltage equal to a power supply voltage is output. In a reverse case, a ground potential is output.

Since the class D amplifier requires no bias current, ideally, power loss is '0' and power efficiency is 100%. The switch elements used in the two switch elements 71 and 72 can be individually configured with a MOS field effect transistor, a bipolar transistor, or the like.

FIG. 8 is a block configuration diagram illustrating an entire configuration example of a conventional radio transmitter using the class D amplifier illustrated in FIG. 7 (for example, see NPL1 and NPL2). As illustrated in FIG. 8, the conventional radio transmitter is configured with an RF signal generator 81, a driver amplifier 82, a class D amplifier 83, and the like. For example, in the case of W-CDMA, a radio signal is generated as a multibit signal of 10 bits or more in a digital baseband '8'.

On the other hand, an input signal of the class D amplifier 83 including the two switch elements 71 and 72 has a complementary pulse waveform as illustrated in FIG. 7, and a signal of only 1 bit having the pulse waveform can be transmitted. Accordingly, an output signal from the digital baseband 810 needs to be converted into 1 bit in advance. In the configuration example of FIG. 8, as a means for a 1-bit conversion, delta-sigma modulators 811 and 812 are used in order to maintain good noise characteristics in the vicinity of a frequency band of a desired wave. According to the present configuration, a radio signal can be converted to a pulse shape signal while maintaining good noise characteristics and can be input to the class D amplifier 83.

CITATION LIST

[NPL1] A. Frappe, B. Stefanelli, A. Flament, A. Kaiser, and A. Cathelin, "A digital ΔΣ F signal generator for mobile communication transmitters in 90 nm CMOS," in IEEE RFIC Symp., pp. 13-16, June 2008.

[NPL2] Hongtao Xu et al., "A Flip-Chip-Packaged 25.3 dBm Class-D Outphasing Power Amplifier In 32 nm CMOS for WLAN Application," IEEE JSSC, VOL. 46, NO. 7, pp. 1596-1605, July 2011.

SUMMARY OF INVENTION

Technical Problem

However, in the current technology, the class D amplifier 83 disclosed in NPL1 as illustrated in FIG. 8 has difficulty in obtaining high output due to the following reasons. Next, the reasons will be described.

FIG. 9 is an explanation diagram for explaining maximum output power of the conventional class D amplifier. In the class D amplifier 83, when a complementary pulse signal having a duty cycle ratio 50% has been input to the switch elements 71 and 72 as the open/close control signal S as illustrated in FIG. 9, output power becomes maximal. When a power supply voltage is defined as Vdd and a load is defined as R_load, the output power Pout_max of the class D amplifier is expressed by the following equation (1).

[Math. 1]
$$\text{Pout\_max} = \left(\frac{2}{\pi^2}\right) \cdot \frac{Vdd^2}{R\_load} \tag{1}$$

In general, since a value of the road R_load is decided from systematic requirements, it is necessary to cope with the systematic requirements by increasing the power supply voltage Vdd for the purpose of high output. On the other hand, the power supply voltage Vdd, which can be applied to the class D amplifier 83, is limited by breakdown voltages of the switch elements 71 and 72 constituting the class D amplifier 83. At the present time, a breakdown voltage of a switch element which is applicable to a mobile phone, a wireless LAN and the like and which can perform a switch operation in an RF band, is usually about several volts at maximum. Therefore, currently, the maximum output power of the class D amplifier is about several hundreds millivolts.

On the other hand, there is used a configuration called a cascode amplifier in which a cascode transistor has been inserted between each of the switch elements 71 and 72 and an output terminal 75 by a circuit technology for improving the breakdown voltage of the class D amplifier 83 to be equal to or higher than the breakdown voltage of the switch element. For example, in the conventional technique disclosed in FIG. 11 (*b*) of NPL2, a class D amplifier, which has a complementary configuration in which a P-type transistor is used as a switch element of a power supply side and an N-type transistor is used as a switch element of a ground (GND) side, is employed, and a switch element of the same type is inserted between a drain terminal and an output terminal of a transistor constituting each of the two switch elements, so that a breakdown voltage is improved twice.

However, at the present time, as a P-type element capable of performing a switching operation in an RF band, only a MOS transistor having a breakdown voltage of about 1 V is available. Accordingly, under the situation in which a breakdown voltage of several volts or higher is required in a class D amplifier, the class D amplifier needs to be configured using only an N-type element which has a high breakdown voltage and can perform a switching operation in an RF band. However, when the class D amplifier is configured using only the N-type element in order to improve a breakdown voltage, there is the following difficulty.

FIG. 10A, FIG. 10B, and FIG. 10C are circuit diagrams illustrating configuration examples of a conventional cascode type class D amplifier configured using only an N-type element. FIG. 10A illustrates a circuit configuration of the cascode type class D amplifier, FIG. 10B illustrates an operation when output of the cascode type class D amplifier is Low output, and FIG. 10C illustrates an operation when the output of the cascode type class D amplifier is High output. In FIG. 10A, FIG. 10B, and FIG. 10C, as an N-type transistor element to be individually applied to the switch elements 71 and 72, a depletion type GaAs MESFET capable of performing a switching operation in an RF band and having a breakdown voltage of several volts is assumed. Furthermore, FIG. 10A, FIG. 10B, and FIG. 10C illustrate the cases in which when an element breakdown voltage of each of the switch elements 71 and 72 is defined as VDD, a gate-source potential is in an ON state (0 V) and is in an OFF state (−Voff, Voff is a positive value).

The present cascode type class D amplifier has a configuration in which a gate-grounded cascode transistor 71a has been inserted between the switch element 71 arranged at a power supply 73 side and a power supply 73 and a gate-grounded cascode transistor 72a has been inserted between the switch element 72 arranged at a ground (GND) 74 side and an output terminal 75 as illustrated in FIG. 10A. By employing such a cascode configuration, even when 2 VDD corresponding to twice of the element breakdown voltage VDD has been applied as a power supply voltage as illustrated in FIG. 10B and FIG. 10C, drain-source voltages of each of the switch elements 71 and 72 and each of the cascode transistors 71a and 72a can be allowed not to exceed the VDD, which is a limit of the breakdown voltage, even though output is any one of High and Low. This represents that the breakdown voltage issue has been solved.

However, on the other hand, in the state of the Low output as illustrated in FIG. 10B, a positive voltage is applied between the gates and sources of the cascode transistors 71a and 72a. In general, when a gate-source potential exceeds a specific transistor voltage value called a Schottky potential, a diode employing the gate and the source respectively as an anode and a cathode is formed, so that a current is generated to flow toward the source from the gate. For example, when it is assumed that the element breakdown voltage VDD is about 10 V, an off potential Voff is 0.5 V, and a Schottky potential Vs is about 0.7 V, a large current is generated since a large voltage of about 10 V is applied between both ends of the present diode. This represents high probability that element breakdown will occur due to gate breakdown as well as an increase in current consumption.

Considering the above situation, in order to allow a digital radio transmitter illustrated in FIG. 8 to cope with an application such as a small cell base station requiring output of watt-class or more, it is necessary to employ a class D amplifier using no cascode configuration in the current situation. That is, there is only a method employing a configuration in which a plurality of class D amplifiers having low output of about several hundreds milliwatts are arranged in parallel to one another by using a power supply voltage not exceeding the element breakdown voltage VDD to perform power combining of individual outputs, resulting in a problem that the radio transmitter increases in size.

Object of the Present Invention

The present invention has been made to solve the above-described problems, and an object of the present invention is to provide a switching amplifier and a radio transmitter, capable of operating at a power supply voltage exceeding an element breakdown voltage.

Solution to Problem

In order to solve the aforementioned problems, the switching amplifier and the radio transmitter according to the present invention mainly employ the following characteristic configurations.

(1) A switching amplifier according to the present invention includes at least a first input transistor that receives one of two input signals operating in a complementary manner, a first cascode transistor cascade-connected between the first input transistor and a power supply, a second input transistor that receives a remaining one of the two input signals, and a second cascode transistor cascade-connected between the second input transistor and the first input transistor, and extracts an output signal, a connection point between the first input transistor and the second cascode transistor being used as an output terminal, wherein a first potential limiting circuit and a second potential limiting circuit for limiting a potential fluctuation range are respectively connected to an input terminal of the first cascode transistor and an input terminal of the second cascode transistor.

(2) A radio transmitter according to the present invention has an RF signal generator that generates a transmission signal for radio communication, a driver amplifier that amplifies the transmission signal of output of the RF signal generator, and a switching amplifier that is driven by the output of the driver amplifier and amplifies the transmission signal, wherein the switching amplifier is configured using the switching amplifier according to (1).

Advantageous Effect of Invention

According to the switching amplifier and the radio transmitter of the present invention, it is possible to obtain the following effects. That is, in the switching amplifier of the present invention, even when a voltage exceeding an element breakdown voltage is applied, it is possible to suppress a voltage applied to each internal element so as to be equal to or lower than the element breakdown voltage, so that it is possible to prevent element breakdown and to increase output power. When the switching amplifier is used, it is possible to achieve a small and high output radio transmitter and to achieve miniaturization and high output of a radio communication equipment such as a mobile phone and a wireless LAN.

BRIEF DESCRIPTION OF DRAWINGS

FIG. 3B is an explanation diagram for explaining an example in which output at an output terminal of the switching amplifier of the radio transmitter illustrated in FIG. 1 is in a High state.

FIG. 9 is an explanation diagram for explaining maximum output power of a conventional class D amplifier

DESCRIPTION OF EMBODIMENTS

Hereinafter, preferred example embodiments of a switching amplifier and a radio transmitter according to the present invention will be described with reference to the accompanying drawings. The radio transmitter according to the present invention is configured with an RF signal generator for generating a transmission signal for radio communication, a driver amplifier for driving a switching amplifier arranged at a rear stage, and the switching amplifier according to the present invention. In the following description, the switching amplifier will be mainly described. It goes without saying that reference signs added to the following each drawing are added to each element for the purpose of convenience as an example for helping the understanding, and are not intended to limit the present invention to the illustrated example embodiments.

Characteristics of the Present Invention

Before describing example embodiments of the present invention, overview of characteristics of the present invention will be first described. According to the present invention, in a switching amplifier in which a connection part is connected to an output terminal, the connection part including two input transistors that are cascade-connected between a power supply and a ground and that constitutes a high-side part and a low-side part, a cascode transistor is further cascade-connected to each of the two input transistors, and potential limiting circuits for limiting a potential fluctuation range are individually connected to input terminals of the two input transistors. Consequently, even when a voltage exceeding an element breakdown voltage of each transistor is applied as a power supply voltage, it is possible to suppress a voltage applied to each internal element so as to be equal to or lower than the element breakdown voltage, so that it is possible to reliably prevent element breakdown of each transistor. That is, a breakdown voltage of a cascode type class D amplifier configured using only an N-type transistor is raised to be equal or higher than the element breakdown voltage and thus output power can increase, so that it is possible to achieve a small and high output radio transmitter and to achieve miniaturization and high output of a radio communication equipment such as a mobile phone and a wireless LAN.

Configuration Example of First Example Embodiment

Figure 1:
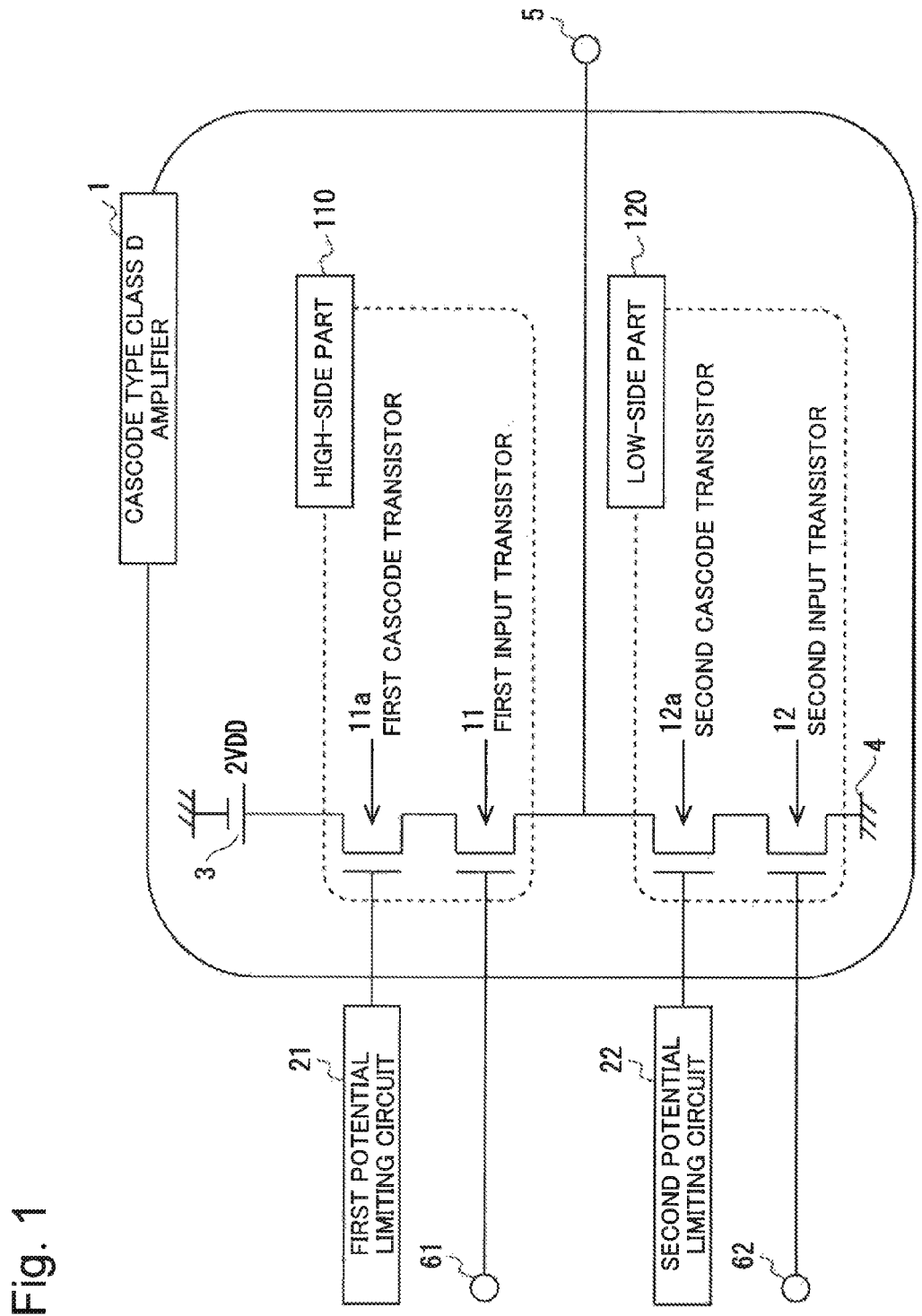
FIG. 1 is a block configuration diagram illustrating a configuration example of a switching amplifier for configuring a radio transmitter in a first example embodiment of the present invention.

Next, a configuration example of the switching amplifier of the radio transmitter as an example embodiment of the present invention will be described in detail with reference to FIG. 1. FIG. 1 is a block configuration diagram illustrating a configuration example of the switching amplifier for configuring the radio transmitter in the first example embodiment of the present invention.

Figure 10A:
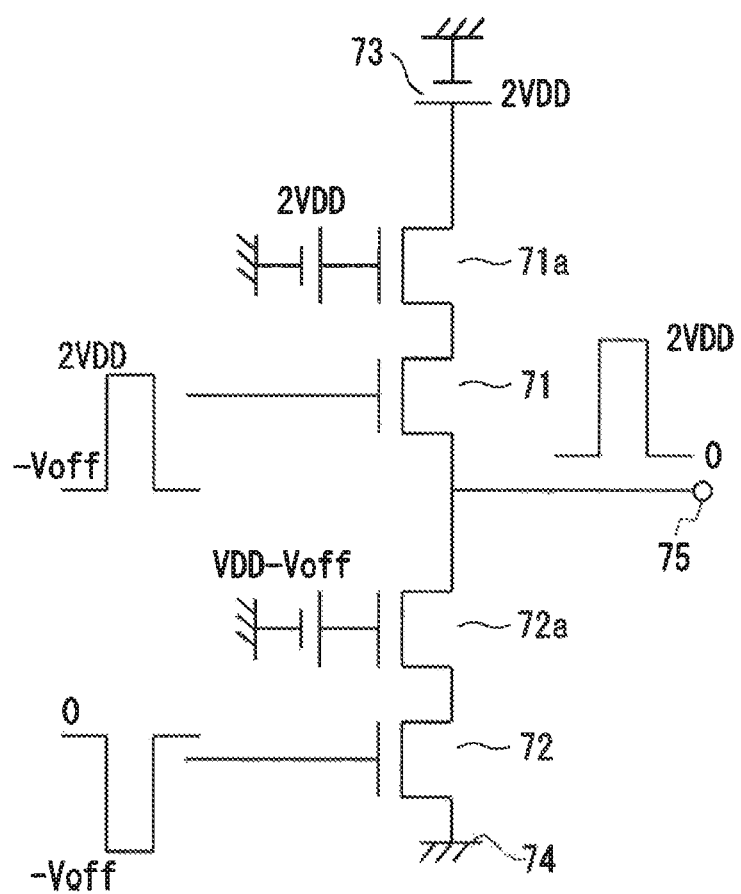
FIG. 10A is a circuit diagram illustrating a configuration example of a conventional cascode type class D amplifier configured using only an N-type element.
Figure 10B:
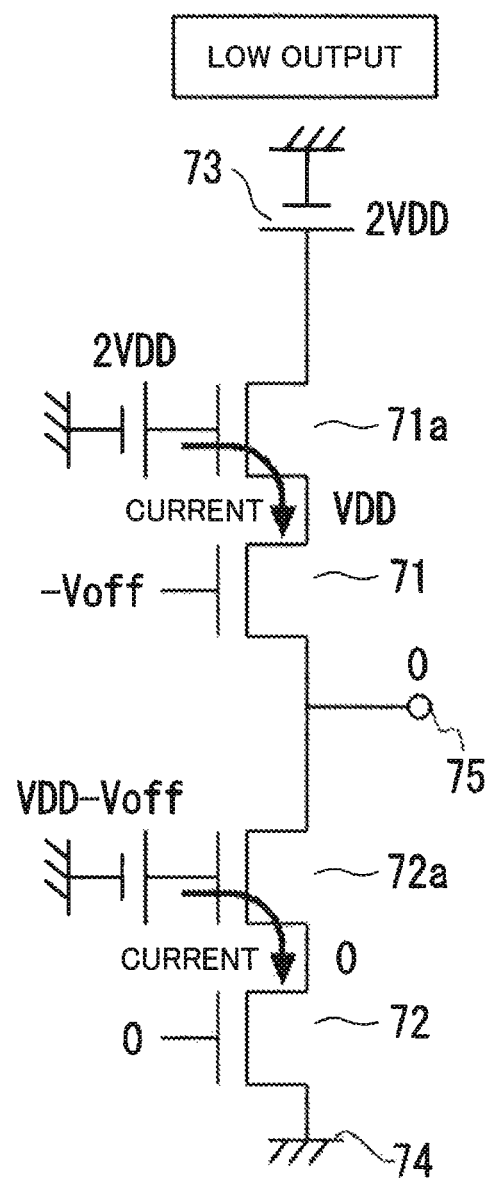
FIG. 10B illustrates a case in which output of a conventional cascode type class D amplifier is Low output.
Figure 10C:
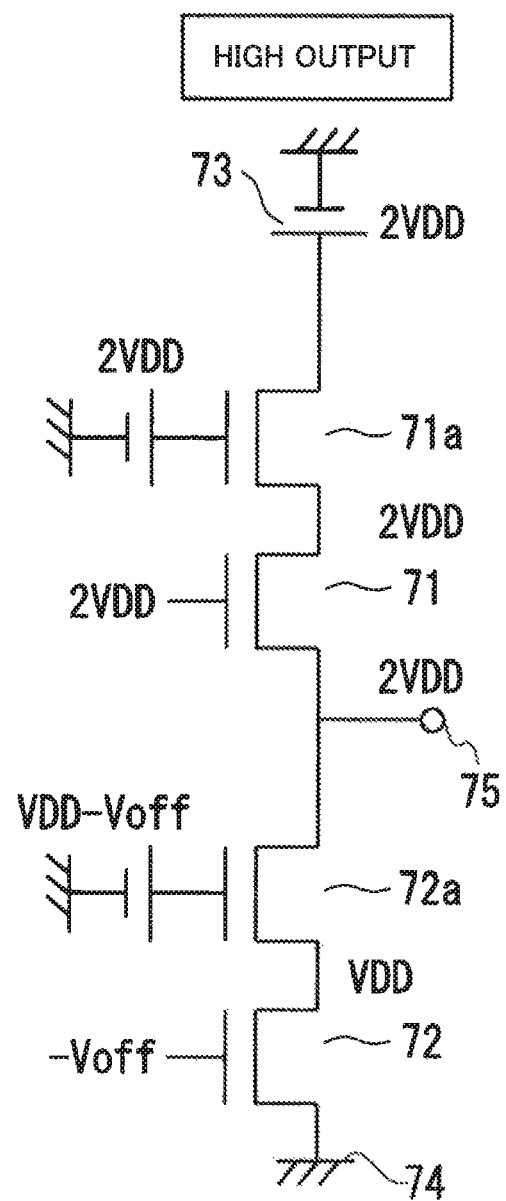
FIG. 10C illustrates a case in which output of a conventional cascode type class D amplifier is High output.

The switching amplifier of the radio transmitter illustrated in FIG. 1 is configured with a cascode type class D amplifier 1 configured using only an N-type transistor, a first potential limiting circuit 21, and a second potential limiting circuit 22. The cascode type class D amplifier 1 has the same configuration as that of a conventional cascode type class D amplifier illustrated in FIG. 10. That is, the cascode type class D amplifier 1 has a configuration in which a high-side part 110 and a low-side part 120 are cascade-connected to each other and an output terminal 5 is connected to a connection point of both parts, wherein the high-side part 110 is arranged between the output terminal 5 of an output node and a power supply 3 of a power node and the low-side part 120 is arranged between the output terminal 5 of the output node and a ground 4 of a ground node.

The high-side part 110 includes at least a first input transistor 11, which receives an input signal input from a first input terminal 61 as one (for example, an input signal of a positive side) of two complementary input signals, and a first cascode transistor 11a inserted between the first input transistor 11 and the power supply 3 of the power node. Similarly, the low-side part 120 includes at least a second input transistor 12, which receives an input signal input from a second input terminal 62 as the other one (for example, an input signal of a negative side) of the two complementary input signals, and a second cascode transistor 12a inserted between the second input transistor 12 and the output terminal 5 of the output node.

Figure 2:
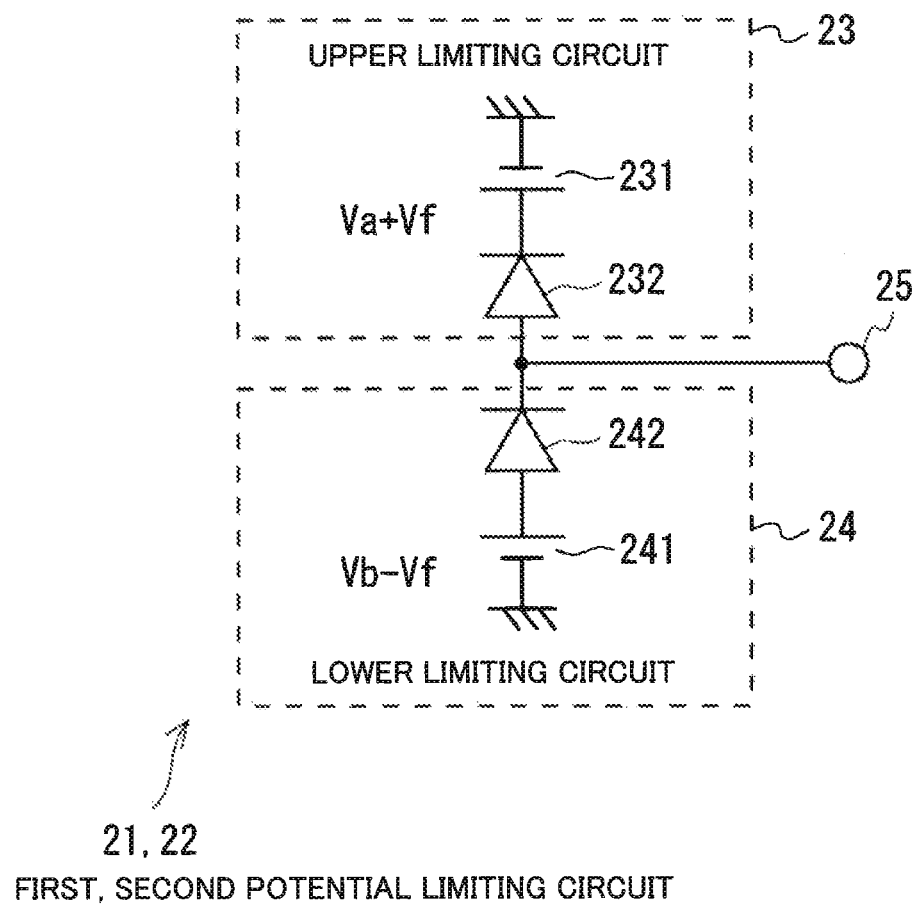
FIG. 2 is a circuit diagram illustrating an example of internal configurations of a first potential limiting circuit and a second potential limiting circuit illustrated in FIG. 1.

The first potential limiting circuit 21 and the second potential limiting circuit 22 are circuits for respectively limiting potential fluctuation ranges of the high-side part 110 and the low-side part 120 in the cascode type class D amplifier 1, and are respectively connected to an input terminal (a gate) of the first cascode transistor 11a of the high-side part 110 and an input terminal (a gate) of the second cascode transistor 12a of the low-side part 120 in the cascode type class D amplifier 1. As illustrated in FIG. 2, the first potential limiting circuit 21 and the second potential limiting circuit 22 have the same circuit configuration, and are respectively configured with an upper limiting circuit 23 and a lower limiting circuit 24. FIG. 2 is a circuit diagram illustrating an example of an internal configuration of the first potential limiting circuit 21 and the second potential limiting circuit 22 illustrated in FIG. 1.

The upper limiting circuit 23 illustrated in FIG. 2 is a circuit for preventing a potential of a node 25 connected to the present upper limiting circuit 23 from exceeding a setting value set in advance, and is configured with a voltage source 231 and a diode 232 having a cathode side connected to the voltage source 231. That is, the upper limiting circuit 23 is configured by connecting the cathode side of the diode 232 to the voltage source 231 of a fixed DC potential decided in advance as an upper side potential. In the case in which a voltage value of the voltage source 231 is defined as Va and a forward direction potential of the diode 232 is defined as Vf, when the potential of the node 25 connected to the upper limiting circuit 23 is equal to or lower than (Va+Vf), the diode 232 serves as an isolator between the connection node 25 and the voltage source 231. On the other hand, when the potential of the node 25 connected to the upper limiting circuit 23 exceeds (Va+Vf), since a voltage applied to the diode 232 exceeds the forward direction potential Vf in a forward direction, a current flows through the diode 232 and a current flows toward the voltage source 231 from the connection node 25, thereby lowering the potential of the connection node 25. By the above operation, the upper limiting circuit 23 prevents the potential of the connection node 25 from exceeding (Va+Vf).

Furthermore, the lower limiting circuit 24 illustrated in FIG. 2 is a circuit for preventing the potential of the node 25 connected to the present lower limiting circuit 24 from exceeding a setting value set in advance, and is configured with a voltage source 241 and a diode 242 having an anode side connected to the voltage source 241. That is, the lower limiting circuit 24 is configured by connecting the anode side of the diode 242 to the voltage source 241 of a fixed DC potential decided in advance as a lower side potential. In the case in which a voltage value of the voltage source 241 is defined as Vb and a forward direction potential of the diode 242 is defined as Vf, when the potential of the node 25 connected to the lower limiting circuit 24 is equal to or higher than (Vb−Vf), the diode 242 serves as an isolator between the connection node 25 and the voltage source 241. On the other hand, when the potential of the node 25 connected to the lower limiting circuit 24 becomes lower than (Vb−Vf), since a voltage applied to the diode 242 exceeds the forward direction potential Vf in the forward direction, a current flows through the diode 242 and a current flows toward the connection node 25 from the voltage source 241, thereby raising the potential of the connection node 25. By the above operation, the lower limiting circuit 24 prevents the potential of the connection node 25 from becoming less than (Va−Vf).

As described above, the first potential limiting circuit 21 and the second potential limiting circuit 22 perform injection and drawing of a current by the diodes 232 and 242 such that the potential of the connection node 25 connected to both of the output of the first potential limiting circuit 21 and the output of the second potential limiting circuit 22 does not exceed (Va+Vf), which is an upper limit potential value decided in advance, and does not become less than (Vb−Vf), which is a lower limit potential value decided in advance.

Explanation of Operation of First Example Embodiment

Next, an example of a detailed operation of the switching amplifier of the radio transmitter illustrated in FIG. 1 according to the first example embodiment will be described in detail. The transistor elements (the first and second input transistors 11 and 12 and the first and second cascode transistors 11a and 12a) constituting the switching amplifier illustrated in FIG. 1 are N-type elements and each element breakdown voltage is VDD similarly to the case of the transistor elements in the conventional switching amplifier of FIG. 10, and the gate-source potential is assumed to be in an ON state at Von and is assumed to be in an OFF state at −Voff. In general, the ON potential Von in an ON state is a value equal to or lower than a Schottky potential Vs.

In the cascode type class D amplifier 1 constituting the switching amplifier of the present first example embodiment illustrated in FIG. 1, even when a power supply voltage of 2VDD twice as high as the element breakdown voltage VDD has been applied, it is possible to normally operate while maintaining high output power without any element breakdown. This will be described in detail below. Furthermore, in consideration of actual device properties, absolute values of the ON potential Von and the OFF potential −Voff respectively for turning on and off the transistor elements (the first and second input transistors 11 and 12 and the first and second cascode transistors 11a and 12a) can be regarded as values sufficiently smaller than the element breakdown voltage VDD.

It is assumed that a voltage value of the internal voltage source 231 of the upper limiting circuit 23 in the first potential limiting circuit 21, i.e., a voltage value of a first upper voltage source is defined as Va1 and a voltage value of the internal voltage source 241 of the lower limiting circuit 24, i.e., a voltage value of a first lower voltage source is defined as Vb1. Furthermore, it is assumed that a voltage value of the internal voltage source 231 of the upper limiting circuit 23 in the second potential limiting circuit 22, i.e., a voltage value of a second upper voltage source is defined as Va2 and a voltage value of the internal voltage source 241 of the lower limiting circuit 24, i.e., a voltage value of a second lower voltage source is defined as Vb2. The voltage value Va1 of the first upper voltage source, the voltage value Vb1 of the first lower voltage source, the voltage value Va2 of the second upper voltage source, the voltage value Vb2 of the second lower voltage source are set as expressed by Equation (2) below.

[Math. 2]

$$\left.\begin{array}{l} Va1 = 2VDD + Von - Vf \\ Vb1 = VDD - Voff + Vf \\ Va2 = VDD - Voff - Vf \\ Vb2 = Von + Vf \end{array}\right\} \quad (2)$$

That is, the input potential of the first cascode transistor 11a of the high-side part 110 connected to the first potential limiting circuit 21, i.e., the output potential of the first potential limiting circuit 21 is set in a potential range, in which (2VDD+Von) is an upper limit and (VDD−Voff) is a lower limit, in consideration of the forward direction potential Vf of the diode 232. Furthermore, the input potential of the second cascode transistor 12a of the low-side part 120 connected to the second potential limiting circuit 22, i.e., the output potential of the second potential limiting circuit 22 is set in a potential range, in which (VDD−Voff) is an upper limit and Von is a lower limit, in consideration of the forward direction potential Vf of the diode 242.

Figure 3A:
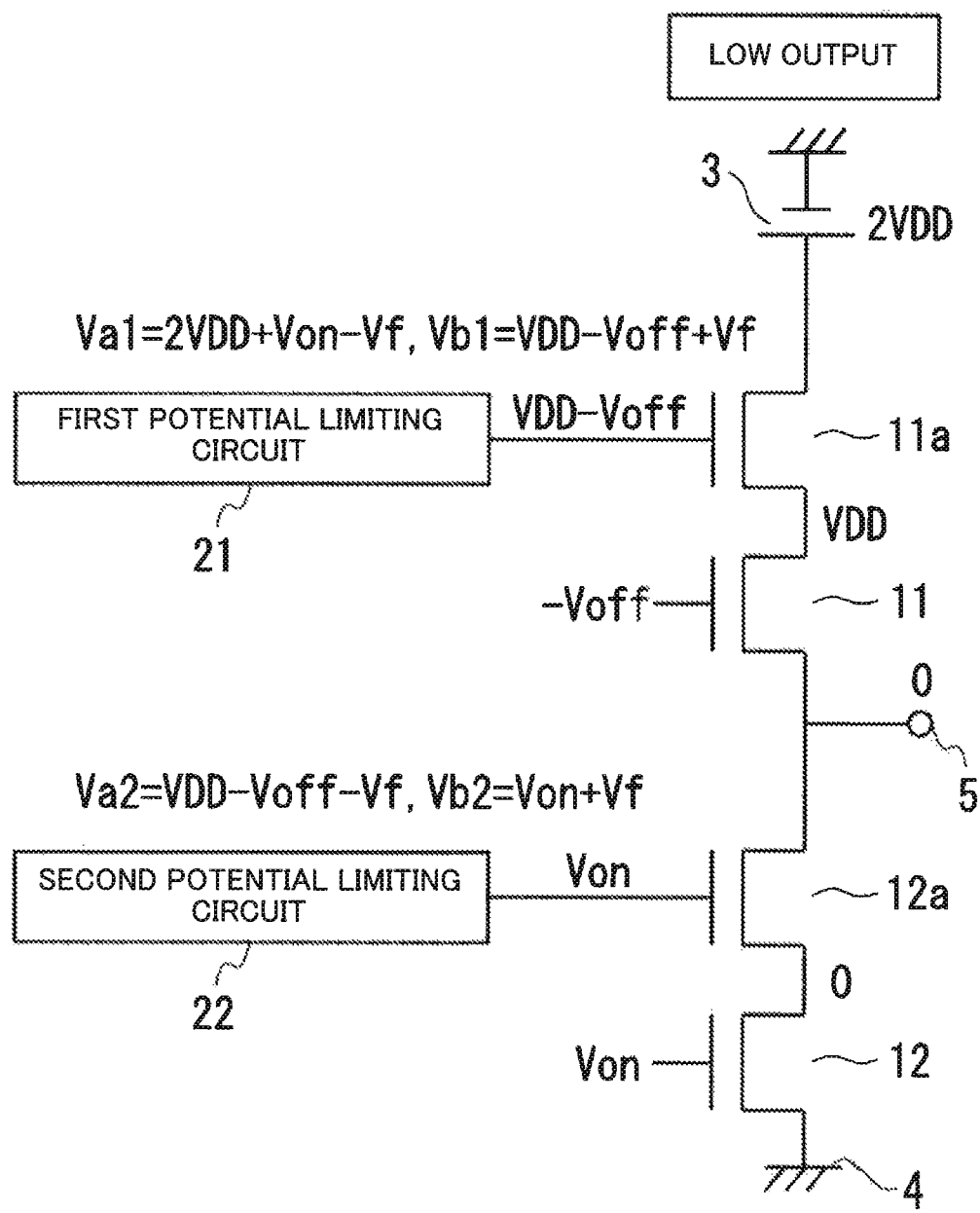
FIG. 3A is an explanation diagram for explaining an example in which output at an output terminal of the switching amplifier of the radio transmitter illustrated in FIG. 1 is in a Low state.

FIG. 3A and FIG. 3B are explanation diagrams for explaining an example of the detailed operation of the switching amplifier of the radio transmitter illustrated in FIG. 1, and illustrate operations examples when a voltage twice as high as the element breakdown voltage VDD of each transistor constituting the cascode type class D amplifier 1 in the switching amplifier has been applied as the power supply voltage of the power supply 3. FIG. 3A illustrates a potential of each node in the cascode type class D amplifier 1 in the state in which output at the output terminal 5 is in a Low state, that is, the output reaches the ground potential, and FIG. 3B illustrates a potential of each node in the cascode type class D amplifier 1 in the state in which the output at the output terminal 5 is in a High state, that is, the output reaches the power supply potential 2VDD.

As illustrated in FIG. 3A, in an initial state, −Voff is input to the gate of the first input transistor 11 of the high-side part 110 as a potential for setting the present first input transistor 11 to be in an OFF state, and Von is input to the second input transistor 12 of the low-side part 120 as a potential for setting the present second input transistor 12 to be in an ON state.

Furthermore, the potentials of input signals of the first cascode transistor 11a of the high-side part 110 and the second cascode transistor 12a of the low-side part 120 of the cascode type class D amplifier 1 respectively are equal to potentials supplied from the first potential limiting circuit 21 and the second potential limiting circuit 22; however, in the initial state, due to gate leakage to the first cascode transistor 11a and the second cascode transistor 12a respectively connected to the first potential limiting circuit and the second potential limiting circuit 21 and 22, the potentials of respective input signals reach a balanced state at lower limit potentials. That is, in the initial state, as illustrated in FIG. 3A, the input potential of the first cascode transistor 11a of the high-side part 110 is (VDD−Voff) and the input potential of the second cascode transistor 12a of the low-side part 120 is Von.

Furthermore, in the state in which the gate-source potentials of the first input transistor 11 of the high-side part 110 and the second input transistor 12 of the low-side part 120 of the cascode type class D amplifier 1 respectively are −Voff and Von, the first input transistor 11 is OFF and the second input transistor 12 is ON.

As described above, since Von is input to the second cascode transistor 12a of the low-side part 120 and the second input transistor 12 of the low-side part 120 is in an ON state, the source potential of the present second cascode transistor 12a is a ground potential. Consequently, the gate-source potential of the present second cascode transistor 12a is Von and the present second cascode transistor 12a is in an ON state. Thus, since the two transistors constituting the low-side part 120, which are arranged between the output terminal 5 of the output node and the ground 4 of the ground node, i.e., the second input transistor 12 and the second cascode transistor 12a are all in an ON state, the potential of the output terminal 5 becomes the ground potential.

As described above, since −Voff is input to the first input transistor 11 of the high-side part 110 and the source potential is equal to the output potential and is the ground potential, the present first input transistor 11 is in an OFF state. On the other hand, the lower limit potential (VDD−Voff) is input to the first cascode transistor 11a of the high-side part 110 from the first potential limiting circuit 21. Since the first input transistor 11 of the high-side part 110 is in an OFF state, the source potential of the present first cascode transistor 11a is a value equal to or higher than VDD at which the present first cascode transistor 11a is not in an ON state. Here, since drain-source leakage currents of the first cascode transistor 11a and the first input transistor 11 of the high-side part 110 are equal to each other, the drain-source voltages of both transistors are equal to each other. That is, the source potential of the first cascode transistor 11a is VDD corresponding to ½ of the power supply voltage 2VDD of the power supply 3.

Consequently, in such a state of the high-side part 110, since all the drain-source potentials of the two transistors constituting the high-side part 110, i.e., the drain-source potentials of the first input transistor 11 and the first cascode transistor 11a can be suppressed to the element breakdown voltage VDD, element breakdown does not occur. Furthermore, since the gate-drain potential and the gate-source voltage of each of the first input transistor 11 and the first cascode transistor 11a are Von at maximum and Von is a value equal to or lower than the Schottky potential Vs as described above, gate breakdown does not occur.

As described above, in the initial state in which the output at the output terminal 5 as illustrated in FIG. 3A is in a Low state, that is, the output reaches the ground potential, it is possible to reliably prevent the occurrence of element breakdown in the cascode type class D amplifier 1 constituting the switching amplifier of the radio transmitter.

Next, using FIG. 3B, a description will be provided for the case in which the initial state as illustrated in FIG. 3A transitions to a state in which the output of the radio transmitter is High, i.e., the output potential of the output terminal 5 of the cascode type class D amplifier 1 becomes the power supply potential 2VDD in a High state.

As illustrated in FIG. 3B, the first input transistor 11 of the high-side part 110 of the cascode type class D amplifier 1 enters a state in which (2VDD+Von) is applied from the state in which −Voff has been input, in order to shift the present first input transistor 11 having been in an OFF state as the initial state to an ON state. Furthermore, the second input transistor 12 of the low-side part 120 enters a state in which −Voff is applied from the state in which Von has been input, in order to shift the present second input transistor 12 having been in an ON state as the initial state to an OFF state.

Furthermore, the gate potential of the first cascode transistor 11a of the high-side part 110 rises with the shift of the gate potential of the first input transistor 11 via two parasitic capacitances (a gate-source capacitance C11 of the first cascode transistor 11a of the high-side part 110 and a gate-drain capacitance C12 of the first input transistor 11 of the high-side part 110) illustrated in FIG. 3B.

Since the shift amount of the gate potential of the first input transistor 11 is (2VDD+Von+Voff), the gate potential of the first cascode transistor 11a is a smaller value of a value obtained by adding the aforementioned shift amount (2VDD+Von+Voff) to (VDD−Voff) of the initial state, and the upper limit (2VDD+Von) of the output of the first potential limiting circuit 21. In this case, the upper limit of the output of the first potential limiting circuit 21 is (2VDD+Von). In such a state, the two transistors constituting the high-side part 110, i.e., the drain-source potentials of the first input transistor 11 and the first cascode transistor 11*a* are in an ON state because the gate-source potential is Von, and the output potential in the output terminal 5 of the cascode type class D amplifier 1 is shifted to the power supply potential 2VDD of the power supply 3 from the ground potential of the initial state.

On the other hand, the gate potential of the second cascode transistor 12*a* of the low-side part 120 rises with the shift of the output potential in the output terminal 5 of the present cascode type class D amplifier 1 via a parasitic capacitance (a gate-drain capacitance C2 of the present second cascode transistor 12*a*) illustrated in FIG. 3B.

As described above, the shift amount of the output potential in the output terminal 5 is the shift amount 2VDD from the ground potential of the initial state, and the gate potential of the present second cascode transistor 12*a* is a smaller value of a value obtained by adding the aforementioned shift amount 2VDD to Von of the initial state, and the upper limit (VDD−Voff) of the output of the second potential limiting circuit 22. In this case, the upper limit of the output of the second potential limiting circuit 22 is (VDD−Voff).

Furthermore, as illustrated in FIG. 3B, since −Voff is input to the second input transistor 12 of the low-side part 120, the present second input transistor 12 is in an OFF state. On the other hand, as described above, the upper limit (VDD−Voff) of the output is input to the second cascode transistor 12*a* from the second potential limiting circuit 22. Since the second input transistor 12 of the low-side part 120 is in an OFF state, the source potential of the present second cascode transistor 12*a* is a value equal to or higher than VDD at which the present second cascode transistor 12*a* does not enter an ON state. Here, since drain-source leakage currents of the second input transistor 12 and the second cascode transistor 12*a* of the low-side part 120 are equal to each other, the drain-source voltages of both transistors are equal to each other. That is, finally, the source potential of the second cascode transistor 12*a* is VDD corresponding to ½ of the output voltage 2VDD.

Consequently, in such a state of the low-side part 120, since all the drain-source potentials of the two transistors constituting the low-side part 120, i.e., the drain-source potentials of the second input transistor 12 and the second cascode transistor 12*a* can be suppressed to the element breakdown voltage VDD, element breakdown does not occur. Furthermore, since the gate-drain potential and the gate-source potential of each of the second input transistor 12 and the second cascode transistor 12*a* are Von at maximum, and Von is a value equal to or lower than the Schottky potential Vs as described above, gate breakdown does not occur.

As described above, even when the output at the output terminal 5 as illustrated in FIG. 3B is in a High state, that is, the output has shifted to the state of the power supply potential 2VDD, it is possible to reliably prevent the occurrence of element breakdown in the cascode type class D amplifier 1 constituting the switching amplifier of the radio transmitter.

Next, a description will be provided for the case in which the output at the output terminal 5 of the cascode type class D amplifier 1 is shifted from a High state to a Low state. When the output at the output terminal 5 of the cascode type class D amplifier 1 is shifted from the High state to the Low state, the first input transistor 11 of the high-side part 110 enters a state in which −Voff is applied from the state in which (2VDD+Von) has been input, in order to shift the present first input transistor 11 having been in an ON state to an OFF state. Furthermore, the second input transistor 12 of the low-side part 120 enters a state in which Von is applied from the state in which −Voff has been input, in order to shift the present second input transistor 12 having been in an OFF state to an ON state.

Furthermore, the gate potential of the first cascode transistor 11*a* of the high-side part 110 falls with the potential drop of the gate potential of the first input transistor 11 via the two parasitic capacitances (the gate-source capacitance C11 of the first cascode transistor 11*a* of the high-side part 110 and the gate-drain capacitance C12 of the first input transistor 11 of the high-side part 110) illustrated in FIG. 3B.

Since the shift amount of the gate potential of the first input transistor 11 is −(2VDD+Von+Voff), the gate potential of the first cascode transistor 11*a* is a larger value of a value obtained by subtracting the aforementioned shift amount (2VDD+Von+Voff) from (2VDD+Von), and the lower limit (VDD−Voff) of the output of the first potential limiting circuit 21. In this case, the lower limit of the output of the first potential limiting circuit 21 is (VDD−Voff). That is, the two transistors of the high-side part 110, i.e., the first input transistor 11 and the first cascode transistor 11*a* are shifted to the state equal to the initial state illustrated in FIG. 3A.

On the other hand, the gate potential of the second cascode transistor 12*a* of the low-side part 120 falls with the potential drop of the output potential in the output terminal 5 of the present cascode type class D amplifier 1 via the a parasitic capacitance (the gate-drain capacitance C2 of the present second cascode transistor 12*a*) illustrated in FIG. 3B.

Here, the shift amount of the output potential in the output terminal 5 is −2VDD, and the gate potential of the present second cascode transistor 12*a* is a larger value of a value obtained by subtracting the aforementioned shift amount 2VDD from (VDD−Voff), and the lower limit Von of the output of the second potential limiting circuit 22. In this case, the lower limit of the output of the second potential limiting circuit 22 is Von. That is, the two transistors of the low-side part 120, i.e., the second input transistor 12 and the second cascode transistor 12*a* are shifted to the state equal to the initial state illustrated in FIG. 3A.

As described above, even when the output at the output terminal 5 of the cascode type class D amplifier 1 is shifted from the High state to the Low state, since it is shifted to the state equal to the initial state illustrated in FIG. 3A, it is possible to reliably prevent the occurrence of element breakdown in the cascode type class D amplifier 1 constituting the switching amplifier of the radio transmitter.

Consequently, the radio transmitter employing the switching amplifier illustrated in FIG. 1 can operate by using a power supply voltage twice as high as the element breakdown voltage VDD while reliably preventing element breakdown. Furthermore, it is possible to achieve a small and high output radio transmitter and to preferably apply the radio transmitter to radio communication equipment such as a mobile phone and a wireless LAN.

Configuration Example of Second Example Embodiment

Figure 4:
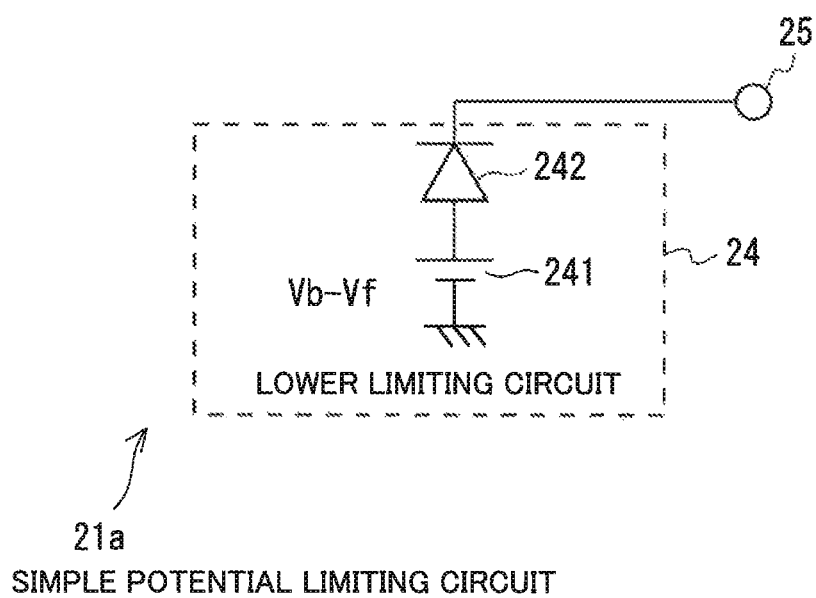
FIG. 4 is a circuit diagram illustrating a configuration example of an internal configuration of a simple potential limiting circuit simplified more than the first potential limiting circuit illustrated in FIG. 2.

Next, a configuration example of a switching amplifier of a radio transmitter in a second example embodiment of the present invention will be described in detail with reference to FIG. 4. FIG. 4 is a circuit diagram illustrating a configuration example of an internal configuration of a simple potential limiting circuit simplified more than the first potential limiting circuit 21 illustrated in FIG. 2.

In the present second example embodiment, the second potential limiting circuit 22 used for potential limitation of the low-side part 120 side has a circuit configuration similar to that of the first example embodiment of FIG. 2; however, potential limitation of the high-side part 110 side is configured using a simple potential limiting circuit 21a configured as illustrated in FIG. 4 by removing the upper limiting circuit 23 from the first potential limiting circuit 21 of the first example embodiment illustrated in FIG. 2 and using the simple potential limiting circuit 21a configured with a simple circuit configuration using only the lower limiting circuit 24. That is, as will be described below, even when the first potential limiting circuit 21 of the first potential limiting circuit 21 and the second potential limiting circuit 22 of the switching amplifier is configured using the simple potential limiting circuit 21a as illustrated in FIG. 4, a radio transmitter employing such a switching amplifier can operate by using a power supply voltage twice as high as the element breakdown voltage VDD while reliably preventing element breakdown.

Figure 5:
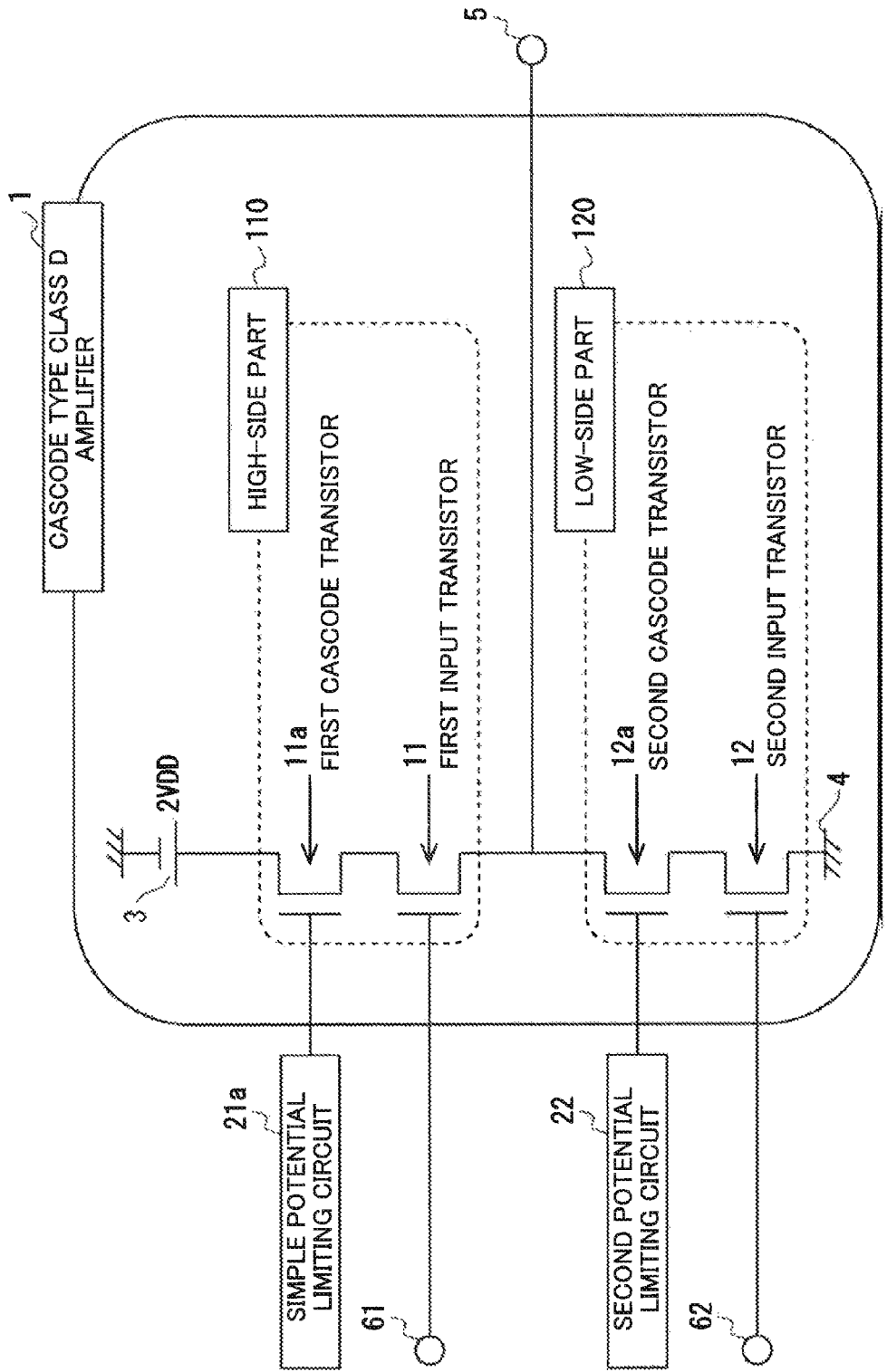
FIG. 5 is a block configuration diagram illustrating a configuration example of a switching amplifier for configuring a radio transmitter in a second example embodiment of the present invention.

FIG. 5 is a block configuration diagram illustrating a configuration example of the switching amplifier for configuring the radio transmitter in the second example embodiment of the present invention. The switching amplifier of the radio transmitter illustrated in FIG. 5 is configured with the cascode type class D amplifier 1 configured using only an N-type transistor, the simple potential limiting circuit 21a, and the second potential limiting circuit 22, and is completely similar to each element of the switching amplifier of FIG. 1, except that the simple potential limiting circuit 21a is used instead of the first potential limiting circuit 21 of the first example embodiment of FIG. 1.

When a voltage value of the internal voltage source 241 of the lower limiting circuit 24 in the simple potential limiting circuit 21a illustrated in FIG. 4, i.e., a voltage value of a first lower voltage source, is defined as Vb3, a voltage value Vb3 of the first lower voltage source is set as expressed by Equation (3) below. A voltage value Va2 of a second upper voltage source and a voltage value Vb2 of a second lower voltage source in the second potential limiting circuit 22 are set to values completely equal to those of Equation (2) in the first example embodiment. That is, the input potential of the second cascode transistor 12a of the low-side part 120 connected to the second potential limiting circuit 22, i.e., the output potential of the second potential limiting circuit 22 is set in a potential range in which (VDD−Voff) is an upper limit and Von is a lower limit.

[Math. 3]

$$Vb3 = VDD - Voff + Vf \quad (3)$$

Such setting is made, so that the lower limit potential of input of the first cascode transistor 11a of the high-side part 110 of the cascode type class D amplifier 1 illustrated in FIG. 5 is (VDD−Voff). Furthermore, when the potential of the input of the first cascode transistor 11a exceeds (2VDD+Vs), since a bias exceeding the Schottky potential Vs is applied in a forward direction of a diode parasitically formed between the gate and drain of the first cascode transistor 11a, a current flows toward the drain terminal from the gate. Consequently, by such an operation, the upper limit potential of the input of the first cascode transistor 11a is suppressed to (2VDD+Vs).

In the case of the switching amplifier of the radio transmitter of the first example embodiment illustrated in FIG. 1, the upper limit of the output potential in the first potential limiting circuit 21 corresponding to the simple potential limiting circuit 21a is (2VDD+Von) as described above. In such a case, the upper limit of the output potential in the first potential limiting circuit 21, which is input to the first cascode transistor 11a, is a potential that turns on the first cascode transistor 11a of the high-side part 110 when the output of the present radio transmitter, i.e., the output at the output terminal 5 of the cascode type class D amplifier 1 is in a High state (the power supply potential 2VDD) as illustrated in FIG. 3B.

In general, in the case of a transistor made with GaAs and the like, a gate-source potential Von in an ON state is a value slightly lower than the Schottky potential Vs, so that the upper limit of the potential output by the present simple potential limiting circuit 21a is slightly larger than the upper limit of the potential output by the first potential limiting circuit 21 of the first example embodiment. Consequently, even when the output of the radio transmitter of the present second example embodiment illustrated in FIG. 5, i.e., the output at the output terminal 5 the cascode type class D amplifier 1 is in a High state, it can be regarded as a potential that turns on the first cascode transistor 11a of the high-side part 110 similarly to the case of the first example embodiment. This represents that the switching amplifier of the radio transmitter of the present second example embodiment illustrated in FIG. 5 operates similarly to the switching amplifier of the radio transmitter of the first example embodiment illustrated in FIG. 1. Furthermore, the upper limit value of the input potential of the first cascode transistor 11a of the high-side part 110 does not exceed (2VDD+Vs), so that it is also possible to reliably prevent the occurrence of gate breakdown.

Consequently, the radio transmitter employing the switching amplifier illustrated in FIG. 5 can operate by using a power supply voltage twice as high as the element breakdown voltage VDD while reliably preventing element breakdown, similarly to the radio transmitter employing the switching amplifier of the first example embodiment of FIG. 1. Furthermore, it is possible to achieve a small and high output radio transmitter and to preferably apply the radio transmitter to radio communication equipment such as a mobile phone and a wireless LAN.

In a modification example of the present second example embodiment, reversely to the cases of FIG. 4 and FIG. 5, the first potential limiting circuit 21 for the potential limitation of the high-side part 110 side may have the same configuration as that of the first example embodiment, and the potential limitation of the low-side part 120 side may be configured having a simple circuit configuration by removing the lower limiting circuit 24 from the second potential limiting circuit 22 of the first example embodiment illustrated in FIG. 2 and using a simple potential limiting circuit configured with a simple circuit configuration using only the upper limiting circuit 23. Even in such a configuration, similarly to the radio transmitter employing the switching amplifier of the first example embodiment of FIG. 1, the radio transmitter can operate by using a power supply voltage twice as high as the element breakdown voltage VDD while reliably preventing element breakdown. Consequently, it is possible to achieve a small and high output radio transmitter and to preferably apply the radio transmitter to radio communication equipment such as a mobile phone and a wireless LAN.

When a voltage value of the internal voltage source 231 of the upper limiting circuit 23 in the aforementioned simple potential limiting circuit used instead of the second potential limiting circuit 22, i.e., a voltage value of the second upper voltage source is defined as Va3, a voltage value Va3 of the second lower voltage source is set as expressed by Equation (4) below. A voltage value Va1 of a first upper voltage source in the first potential limiting circuit 21 and a voltage value Vb1 of the first lower voltage source are set to values completely equal to those of Equation (2) in the first example embodiment.

[Math. 4]

$$Va3 = VDD - Voff - Vf \quad (4)$$

That is, the input potential of the first cascode transistor 11a of the high-side part 110 connected to the first potential limiting circuit 21, i.e., the output potential of the first potential limiting circuit 21 is set in a potential range in which (2VDD+Von) is an upper limit and (VDD−Voff) is a lower limit. Furthermore, the input potential of the second cascode transistor 12a of the low-side part 120 connected to the second potential limiting circuit 22, i.e., the output potential of the second potential limiting circuit 22 is set in a potential range in which (VDD−Voff) is an upper limit and the Schottky potential Vs is a lower limit.

Configuration Example of Third Example Embodiment

Figure 6:
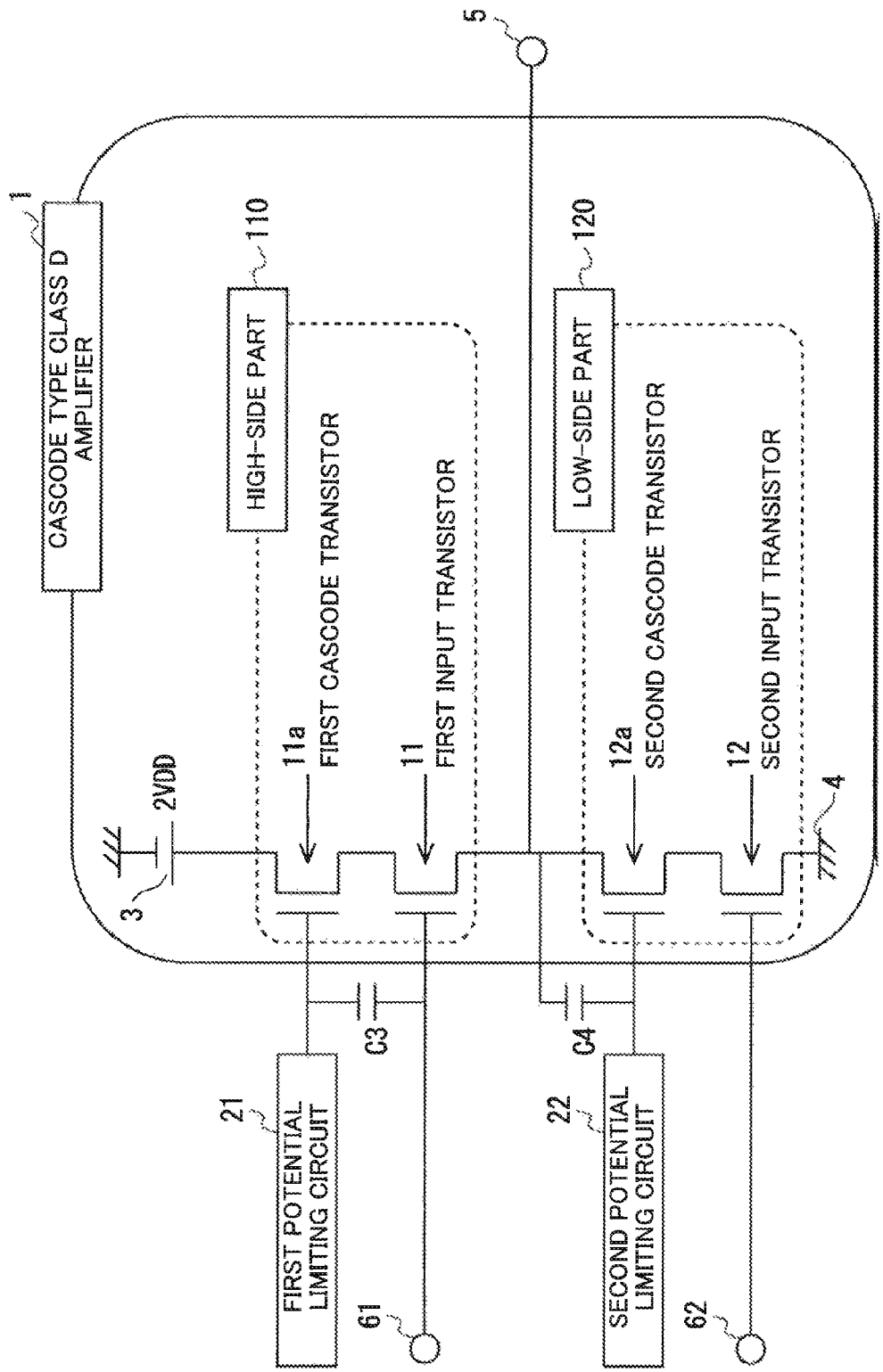
FIG. 6 is a block configuration diagram illustrating a configuration example of a switching amplifier for configuring a radio transmitter in a third example embodiment of the present invention.
Figure 7:
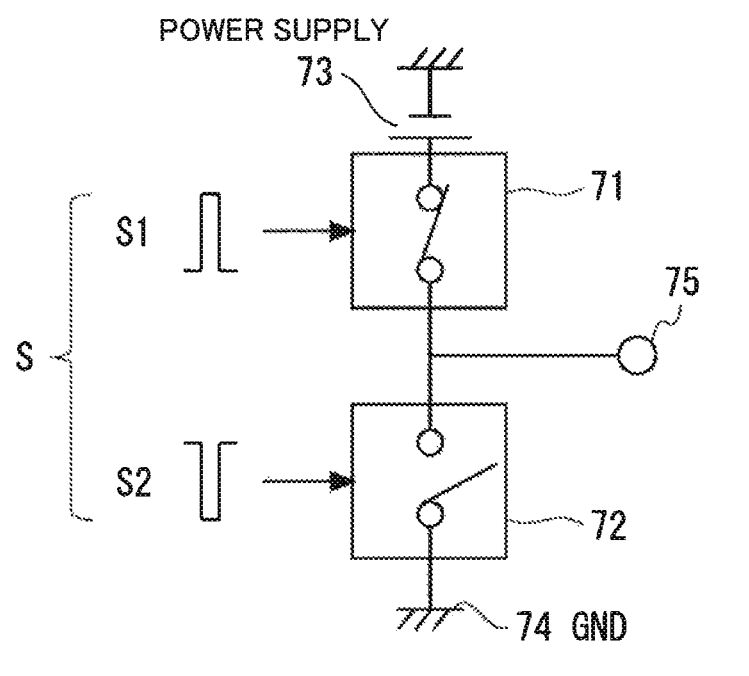
FIG. 7 is a circuit diagram illustrating a class D amplifier which is a representative example of a conventional switching amplifier.
Figure 8:
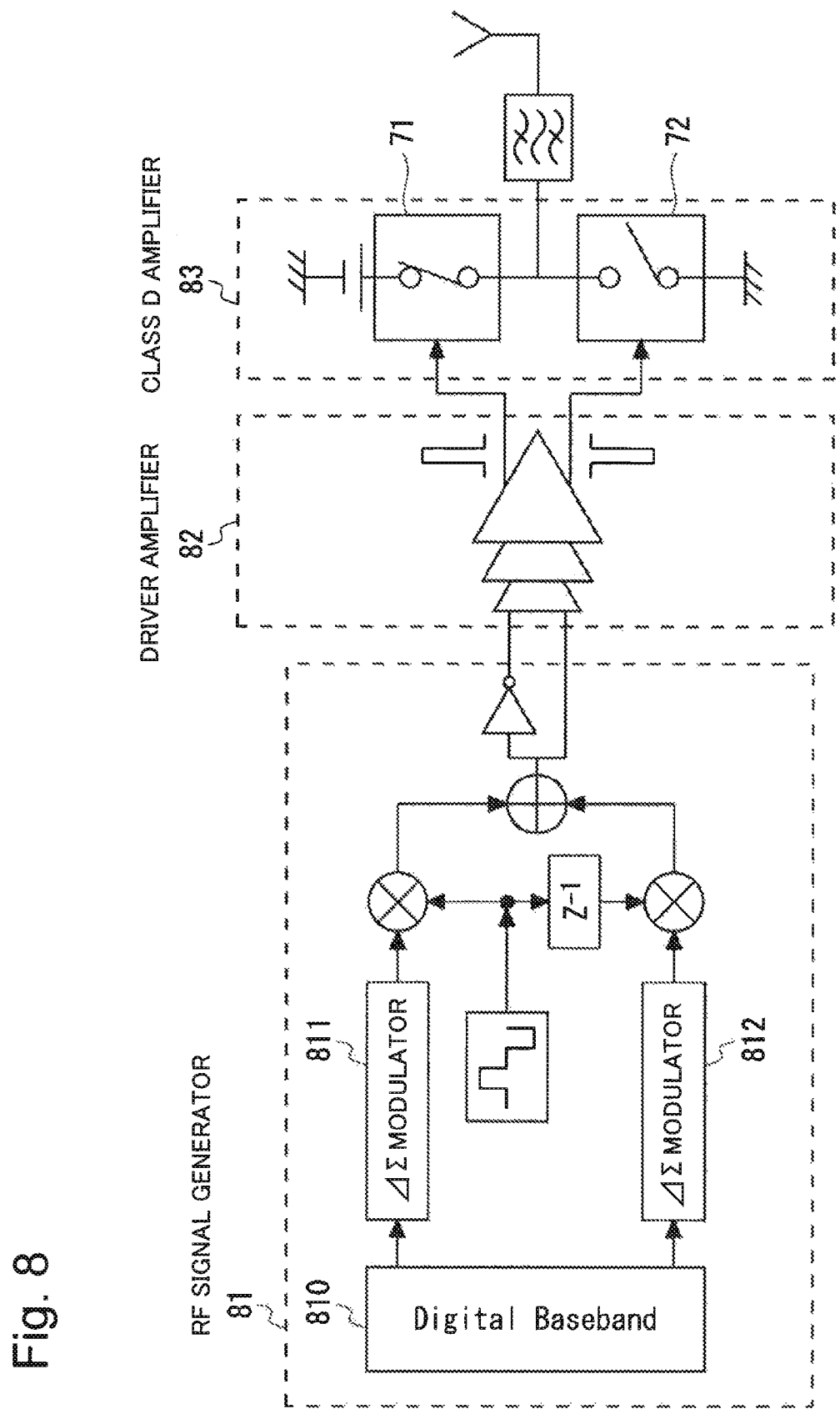
FIG. 8 is a block configuration diagram illustrating an entire configuration example of a conventional radio transmitter using the class D amplifier illustrated in FIG. 7.

Next, a configuration example of a switching amplifier of a radio transmitter in a third example embodiment of the present invention will be described in detail with reference to FIG. 6. FIG. 6 is a block configuration diagram illustrating a configuration example of the switching amplifier for configuring the radio transmitter in the third example embodiment of the present invention.

The switching amplifier of the radio transmitter illustrated in FIG. 6 is configured with a cascode type class D amplifier 1 configured using only an N-type transistor, a first potential limiting circuit 21, a second potential limiting circuit 22, a first capacitive element C3, and a second capacitive element C4. The cascode type class D amplifier 1, the first potential limiting circuit 21, and the second potential limiting circuit 22 are the same as those of the first example embodiment. That is, the cascode type class D amplifier 1 has a configuration in which the high-side part 110 and the low-side part 120 are cascade-connected to each other and the output terminal 5 is connected to the connection point of both parts, wherein the high-side part 110 is arranged between the output terminal 5 of the output node and the power supply 3 of the power node and the low-side part 120 is arranged between the output terminal 5 of the output node and the ground 4 of the ground node.

The high-side part 110 includes at least the first input transistor 11, which receives an input signal input from the first input terminal 61 as one of two complementary input signals, and the first cascode transistor 11a inserted between the first input transistor 11 and the power supply 3 of the power node. Similarly, the low-side part 120 includes at least the second input transistor 12, which receives an input signal input from the second input terminal 62 as the other one of the two complementary input signals, and the second cascode transistor 12a inserted between the second input transistor 12 and the output terminal 5 of the output node.

The first potential limiting circuit 21 and the second potential limiting circuit 22 are circuits for respectively limiting potential fluctuation ranges of the high-side part 110 and the low-side part 120 in the cascode type class D amplifier 1, and are respectively connected to the input terminal (the gate) of the first cascode transistor 11a of the high-side part 110 and the input terminal (the gate) of the second cascode transistor 12a of the low-side part 120 in the cascode type class D amplifier 1.

Between the first capacitive element C3 and the second capacitive element C4 newly added in the third example embodiment, the first capacitive element C3 is connected between the input node (the gate) of the first cascode transistor 11a of the high-side part 110 and the input node (the gate) of the first input transistor 11 of the high-side part 110. On the other hand, the second capacitive element C4 is connected between the input node (the gate) of the second cascode transistor 12a of the low-side part 120 and output of the present radio transmitter, i.e., the output terminal 5 (the output node) of the cascode type class D amplifier 1.

In the switching amplifier of the radio transmitter illustrated in FIG. 6, an input signal to the first input transistor 11 of the high-side part 110 is also transferred to the input part (the gate) of the first cascode transistor 11a of the high-side part 110 by the first capacitive element C3. That is, the function of the first capacitive element C3 performs operations similar to those of the parasitic capacitances C11 and C12 illustrated in FIG. 3B in the first example embodiment.

Furthermore, in the switching amplifier of the radio transmitter illustrated in FIG. 6, an output signal of the present radio transmitter, i.e., an output signal in the output terminal 5 of the cascode type class D amplifier 1 is also transferred to the input part (the gate) of the second cascode transistor of the low-side part 120 by the second capacitive element C4. That is, the function of the second capacitive element C4 performs operations similar to those of the parasitic capacitance C2 illustrated in FIG. 3B in the first example embodiment.

In addition, values of the parasitic capacitances C11, C12, and C2 in the first example embodiment are obtained from characteristics of each corresponding transistor and are not changeable by a designer. In contrast, parameters of the first capacitive element C3 and the second capacitive element C4 in the present third example embodiment can be freely set to any value by a designer. Thus, in the present third example embodiment, values of the first capacitive element C3 and the second capacitive element C4 are appropriately changed for setting, so that it is possible to appropriately adjust the degree of coupling between the input of the first input transistor 11 of the high-side part 110 and the input of the first cascode transistor 11a, and the degree of coupling between the input of the second cascode transistor 12a of the low-side part 120 and the output at the output terminal 5.

Consequently, the radio transmitter of the present third example embodiment can perform more stable operations than the radio transmitter of the first example embodiment. In addition, even in the case of using only one of the first capacitive element C3 and the second capacitive element C4, it goes without saying that more stable operations are performed than the radio transmitter of the first example embodiment.

So far, the configurations of the preferred example embodiments of the present invention have been described. However, it should be noted that the example embodiments are illustrative examples of the present invention and do not limit the present invention. It can be understood to one skilled in the art that various modifications and changes can be made according to specific uses without departing from the scope of the present invention.

This application is based upon and claims the benefit of priority from Japanese patent application No. 2014-158527, filed on Aug. 4, 2014, the disclosure of which is incorporated herein in its entirety by reference.

REFERENCE SIGNS LIST 1 cascode type class D amplifier
3 power supply
4 ground (GND)
5 output terminal
11 first input transistor
11a first cascode transistor
12 second input transistor
12a second cascode transistor
21 first potential limiting circuit
21a simple potential limiting circuit
22 second potential limiting circuit
23 upper limiting circuit
24 lower limiting circuit
25 node (connection node)
61 first input terminal
62 second input terminal
71 switch element
72 switch element
73 power supply
74 ground (GND)
75 output terminal
81 RF signal generator
82 driver amplifier
83 class D amplifier
110 high-side part
120 low-side part
231 voltage source (internal voltage source)
232 diode
241 voltage source (internal voltage source)
242 diode
810 digital baseband
811 delta-sigma modulator
812 delta-sigma modulator
C2 parasitic capacitance (gate-drain capacitance)
C3 first capacitive element
C4 second capacitive element
C11 parasitic capacitance (gate-source capacitance)
C12 parasitic capacitance (gate-drain capacitance)
S open/close control signal

The invention claimed is:

1. A switching amplifier comprising at least:
a first input transistor that receives one of two input signals operating in a complementary manner;
a first cascode transistor cascade-connected between the first input transistor and a power supply;
a second input transistor that receives a remaining one of the two input signals; and
a second cascode transistor cascade-connected between the second input transistor and the first input transistor, wherein the switching amplifier extracts an output signal from a connection point between the first input transistor and the second cascode transistor being used as an output terminal, and a first potential limiting circuit and a second potential limiting circuit for limiting a potential fluctuation range are respectively connected to an input terminal of the first cascode transistor and an input terminal of the second cascode transistor.

2. The switching amplifier according to claim 1, comprising at least one of a first capacitive element connected between an input terminal of the first input transistor and the input terminal of the first cascode transistor and having a freely set capacitance value, and a second capacitive element connected between the input terminal of the second cascode transistor and the output terminal and having a freely set capacitance value.

3. The switching amplifier according to claim 1, wherein each of the first potential limiting circuit and the second potential limiting circuit includes both an upper limit limiting circuit that limits an upper limit of the potential fluctuation range of each output potential and a lower limit limiting circuit that limits a lower limit of the potential fluctuation range of the output potential.

4. The switching amplifier according to claim 3, wherein, when each of the first input transistor, the first cascode transistor, the second input transistor, and the second cascode transistor is an N-type element and an element breakdown voltage, an ON voltage, and an OFF voltage of each element are respectively defined as VDD, Von, and −Voff, the upper limit of the potential fluctuation range of the output potential of the first potential limiting circuit is (2VDD+Von), the lower limit of the potential fluctuation range is (VDD−Voff), the upper limit of the potential fluctuation range of the output potential of the second potential limiting circuit is (VDD−Voff), and the lower limit of the potential fluctuation range is Von.

5. The switching amplifier according to claim 1, wherein the first potential limiting circuit includes a lower limit limiting circuit that limits a lower limit of a potential fluctuation range of an output potential and the second potential limiting circuit includes both an upper limit limiting circuit that limits an upper limit of a potential fluctuation range of an output potential and the lower limit limiting circuit, or the first potential limiting circuit includes both the upper limit limiting circuit and the lower limit limiting circuit and the second potential limiting circuit includes the upper limit limiting circuit.

6. The switching amplifier according to claim 5, wherein, when each of the first input transistor, the first cascode transistor, the second input transistor, and the second cascode transistor is an N-type element and an element breakdown voltage, an ON voltage, an OFF voltage, and a Schottky potential of each element are respectively defined as VDD, Von, −Voff, and Vs, the upper limit of the potential fluctuation range of the output potential of the first potential limiting circuit is (2VDD+Von) or (2VDD+Vs), the lower limit of the potential fluctuation range is (VDD−Voff), the upper limit of the potential fluctuation range of the output potential of the second potential limiting circuit is (VDD−Voff), and the lower limit of the potential fluctuation range is Von or Vs.

7. The switching amplifier according to claim 3, wherein the upper limit limiting circuit is configured using a diode in which a cathode side is connected to a fixed DC potential decided as an upper side potential in advance, and the lower limit limiting circuit is configured using a diode in which an anode side is connected to a fixed DC potential decided as a lower side potential in advance.

8. A radio transmitter comprising an RF signal generator that generates a transmission signal for radio communication; a driver amplifier that amplifies the transmission signal of output of the RF signal generator; and a switching amplifier that amplifies the transmission signal, wherein the switching amplifier uses the switching amplifier according to claim 1.

* * * * *